United States Patent
Koo et al.

(10) Patent No.: US 9,397,284 B2
(45) Date of Patent: Jul. 19, 2016

(54) PIEZOELECTRIC CIRCUIT, PIEZOELECTRIC DRIVING CIRCUIT FOR THE PIEZOELECTRIC CIRCUIT, AND PIEZOELECTRIC DRIVING METHOD

(71) Applicant: FAIRCHILD KOREA SEMICONDUCTOR LTD., Bucheon (KR)

(72) Inventors: Gwan-Bon Koo, Bucheon-si (KR); Young Sik Lee, Seoul (KR); Young-Bae Park, Anyang (KR)

(73) Assignee: Fairchild Korea Semiconductor LTD (KR)

( * ) Notice: Subject to any disclaimer, the term of this patent is extended or adjusted under 35 U.S.C. 154(b) by 610 days.

(21) Appl. No.: 13/888,688

(22) Filed: May 7, 2013

(65) Prior Publication Data
US 2013/0293064 A1    Nov. 7, 2013

(30) Foreign Application Priority Data

May 7, 2012    (KR) .................. 10-2012-0048285

(51) Int. Cl.
*H01L 41/107* (2006.01)
*H01L 41/04* (2006.01)

(52) U.S. Cl.
CPC .................... *H01L 41/042* (2013.01)

(58) Field of Classification Search
CPC ............ H03H 9/08; H03H 3/04; H03B 5/32; H04R 17/00; G10K 11/02; H01H 2239/76; H01H 2300/03; H03L 1/028; H02M 7/48; G01L 1/16; B06B 2201/55; H05B 41/822; F02D 41/2086; F02D 41/221; F02D 2041/2003; F02D 2041/2051

USPC .................................................. 310/311-370
See application file for complete search history.

(56) References Cited

U.S. PATENT DOCUMENTS

| | | | |
|---|---|---|---|
| 3,651,352 A * | 3/1972 | Puskas | 310/316.01 |
| 5,886,453 A | 3/1999 | Kyodo | |
| 7,227,294 B2 | 6/2007 | Mazz et al. | |
| 8,555,724 B2 * | 10/2013 | Terazawa | 73/632 |
| 2011/0057543 A1 * | 3/2011 | Adachi | 310/323.02 |
| 2011/0156536 A1 * | 6/2011 | Adachi | 310/323.02 |
| 2011/0309803 A1 * | 12/2011 | Fitzi et al. | 320/166 |
| 2012/0280596 A1 * | 11/2012 | Ide et al. | 310/319 |
| 2013/0069482 A1 * | 3/2013 | Wolff | 310/319 |

FOREIGN PATENT DOCUMENTS

| | | |
|---|---|---|
| CN | 1142289 | 2/1997 |
| CN | 102097972 | 6/2011 |
| WO | 20100146090 | 12/2010 |

* cited by examiner

*Primary Examiner* — Thomas Dougherty
(74) *Attorney, Agent, or Firm* — Grossman Tucker Perreault & Pfleger PLLC

(57) ABSTRACT

The present invention relates to a piezoelectric circuit, a piezoelectric driving circuit driving the piezoelectric circuit, and a method for driving the piezoelectric circuit. The piezoelectric circuit includes a sub-piezoelectric circuit and an external inductor coupled in parallel with the sub-piezoelectric circuit. The external inductor discharges the sub-piezoelectric circuit when a polarity of a piezoelectric voltage, that is, a both-end voltage of the piezoelectric circuit is inverted. The piezoelectric driving circuit includes first and third switches connected to a first node of the piezoelectric circuit and second and fourth switches connected to a second node of the piezoelectric circuit.

20 Claims, 9 Drawing Sheets

PIEZOELECTRIC CIRCUIT, PIEZOELECTRIC DRIVING CIRCUIT FOR THE PIEZOELECTRIC CIRCUIT, AND PIEZOELECTRIC DRIVING METHOD

CROSS-REFERENCE TO RELATED APPLICATION

This application claims priority to and the benefit of Korean Patent Application No. 10-2012-0048285 filed in the Korean Intellectual Property Office on May 7, 2012, the entire contents of which are incorporated herein by reference.

BACKGROUND OF THE INVENTION (a) Field of the Invention

The present invention relates to a piezoelectric circuit, a piezoelectric driving circuit driving the piezoelectric circuit, and a driving method of the piezoelectric circuit.

(b) Description of the Related Art

A piezoelectric circuit can convert electrical energy to mechanical energy and also mechanical energy to electrical energy. A full-bridge driving circuit is used to drive the piezoelectric circuit.

When the piezoelectric circuit includes a capacitor, and switches of the full-bridge driving circuit perform switching operation, a direction of a voltage applied to the piezoelectric circuit is changed. Whenever the direction of the voltage applied to the piezoelectric circuit is changed, a peak current to charge the capacitor of the piezoelectric circuit conducts.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a piezoelectric circuit that can reduce a peak current, a piezoelectric driving circuit, and a piezoelectric driving method through an exemplary embodiment of the present invention.

A piezoelectric circuit according to an exemplary embodiment of the present invention includes a sub-piezoelectric circuit and an external inductor connected to the sub-piezoelectric circuit in parallel, and when a polarity of a piezoelectric voltage, that is, a both-end voltage of the piezoelectric circuit is inverted, the external inductor current helps the sub-piezoelectric circuit discharged.

The sub-piezoelectric circuit includes a series-resonance circuit including a first capacitor, a first inductor, and a resistor that are coupled in series and a second capacitor coupled to the series-resonance circuit in parallel.

A piezoelectric driving circuit according to an exemplary embodiment of the present invention includes sub-piezoelectric circuit connected between a first node and a second node, an external inductor coupled to the sub-piezoelectric circuit in parallel, and a full-bridge circuit including first and third switches connected to the first node and second and fourth switches connected to the second node.

The first switch comprises a first electrode connected to a first voltage, a second electrode connected to the first node, and a control electrode to which a first control voltage is input, and the third switch comprises a first electrode connected to the first node, a second electrode connected to a ground, and a control electrode to which a third control voltage is input.

The second switch includes a first electrode connected to the first voltage, a second electrode connected to the second node, and a control electrode to which a second control voltage is input, and the fourth switch includes a first electrode connected to the second node, a second electrode connected to the ground, and a control electrode to which a fourth control voltage is input.

The first switch is turned on after a first period from a turn-on instant of the fourth switch and turned off earlier by a second period than the fourth switch, and the first period is determined according to a period during which a both-end voltage of the first switch becomes zero by a current of the external inductor and the second period is determined according to a period during which a both-end voltage of the third switch becomes zero by the external inductor current.

The second switch is turned on after a third period from a turn-on instant of the third switch and turned off earlier by a fourth period than the third switch, and the third period is determined according to a period during which a both-end voltage of the second switch becomes zero by the external inductor current and the fourth period is determined according to a period during which a both-end voltage of the fourth switch becomes zero by the external inductor current.

The sub-piezoelectric circuit includes a first capacitor, a first inductor, a resistor, and a second capacitor, and the first capacitor, the first inductor, and the resistor are coupled in series between the first node and the second node and the second capacitor is connected between the first node and the second node.

A driving method of a piezoelectric circuit according to an exemplary embodiment of the present invention includes: turning on the second switch after a first period from a turn-on instant of the third switch, where the first and the third switches connected to a first end of the piezoelectric circuit and the second and the fourth switches connected to a second end of the piezoelectric circuit; turning off the third switch after a second period from a turn-off instant of the second switch; turning on the first switch after a third period from a turn-on instant of the fourth switch; and turning off the fourth switch after a fourth period from a turn-off instant of the first switch. The piezoelectric circuit includes a sub-piezoelectric circuit and an external inductor coupled in parallel with the sub-piezoelectric circuit.

The driving method further include, during the second period, decreasing a both-end voltage of the fourth switch to zero due to discharging of a parasitic capacitor of the fourth switch and the second capacitor by the external inductor current and turning on the fourth switch.

During the second period, a both-end voltage of the second switch is increased by the external inductor current.

The driving method further include, during the third period, decreasing a both-end voltage of the first switch to zero due to discharging of a parasitic capacitor of the first switch by the external inductor current. During the third period, a both-end voltage of the third switch is increased by the external inductor current.

The piezoelectric circuit driving method further includes, during the fourth period, decreasing a both-end voltage of the third switch to zero due to discharging of a parasitic capacitor of the third switch and the second capacitor by the external inductor current and turning on the third switch.

During the fourth period, the both-end voltage of the first switch is increased by the external inductor current.

During the first period, a both-end voltage of the second switch to zero is decreased due to discharging of a parasitic capacitor of the second switch by the external inductor current.

During the first period, a both-end voltage of the fourth switch is increased by the external inductor current.

The piezoelectric circuit driving method further includes, during a turn-on period of the first and fourth switches, supplying a first voltage to a first end of the piezoelectric circuit and supplying a second voltage to a second end of the piezoelectric circuit, and during a turn-on period of the second and third switches, supplying the second voltage to the first end of the piezoelectric circuit and supplying the first voltage to the second end of the piezoelectric circuit.

According to the exemplary embodiments of the present invention, a piezoelectric current that can reduces a peak current, a piezoelectric driving circuit, and a piezoelectric driving method can be provided.

DETAILED DESCRIPTION OF THE EMBODIMENTS

Figure 1:
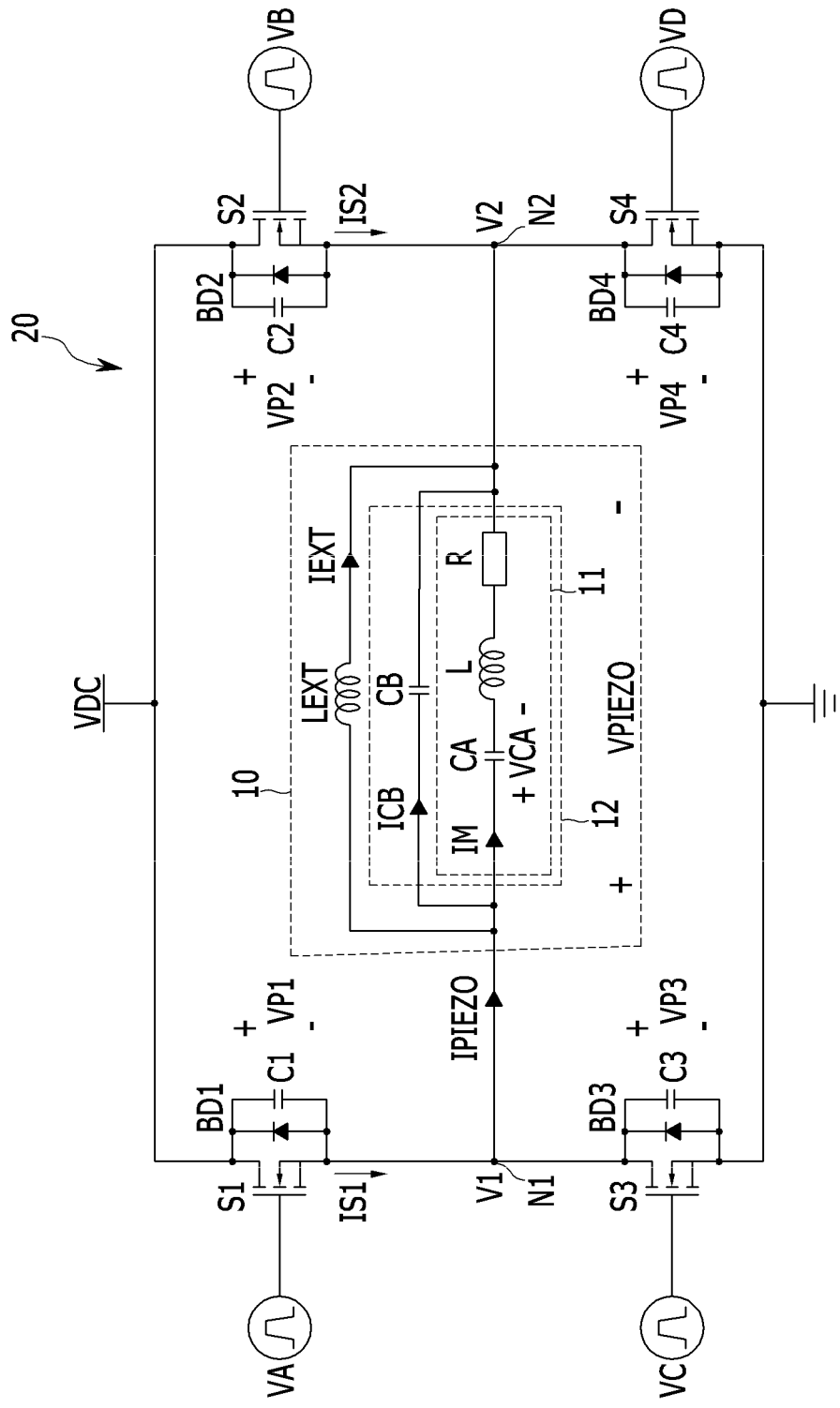
FIG. 1 shows a piezoelectric circuit and a piezoelectric driving circuit according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements.

Hereinafter, a piezoelectric circuit, a piezoelectric driving circuit, and a piezoelectric driving method according to an exemplary embodiment of the present invention will be described.

FIG. 1 shows a piezoelectric circuit and a piezoelectric driving circuit according to an exemplary embodiment of the present invention.

A piezoelectric circuit 10 includes an external inductor LEXT and a sub-piezoelectric circuit 12. The sub-piezoelectric circuit 12 indicates a conventional piezoelectric circuit. That is, the external inductor LEXT according to the exemplary embodiment of the present invention is connected to both ends of the conventional piezoelectric circuit.

For description of the exemplary embodiment of the present invention, the sub-piezoelectric circuit 12 includes a series-resonance circuit 11 including a first inductor L, a first capacitor CA, and a resistor R and a second capacitor CB connected to the series-resonance circuit 11.

The external inductor LEXT is connected to both ends (i.e., a node N1 and a node N2) of the sub-piezoelectric circuit 12. The external inductor LEXT discharges the sub-piezoelectric circuit 12 when a polarity of a piezoelectric voltage VPIEZO, that is, a both-end voltage of the piezoelectric circuit 12 is inverted. Then, when the polarity of the piezoelectric voltage VPIEZO is inverted, the piezoelectric circuit 10, owing to the external inductor LEXT, is discharged faster than the conventional piezoelectric circuit.

However, this is an example of illustration of the sub-piezoelectric circuit 12 into an equivalent circuit. That is, the present invention is not limited to the sub-piezoelectric circuit 12 shown in FIG. 1, and other equivalent circuit for a piezoelectric elements is applicable.

The piezoelectric driving circuit 20 is realized as a full-bridge circuit, and includes four switches S1 to S4. Body diodes BD1 to BD4 and parasitic capacitors C1 to C4 are coupled in parallel between both electrodes of the respective four switches S1 to S4.

The first to fourth switches S1 to S4 according to the exemplary embodiment of the present invention are realized as n channel type MOSFETs. First electrodes of the first to fourth switches S1 to S4 are drain electrodes, and second electrodes are source electrodes, and control electrodes and gate electrodes.

However, the first to the fourth switches of the exemplary embodiment of the present invention are not limited to the MOSFET, and they may be realized as BJTs or IGBTs.

A first end of the piezoelectric circuit 10 is connected to a node N1 of the source electrode of the first switch S1 and the drain electrode of the third switch S3, and a second end of the piezoelectric circuit 10 is connected to a second node N2 of the source electrode of the second switch S2 and the drain electrode of the fourth switch S4.

In the piezoelectric circuit 10, the first capacitor CA, the first inductor L, and resistor R are coupled between the node N1 and the node N2 in series. The serially coupled first capacitor CA, first inductor L, and resistor R form a series-resonance circuit.

The second capacitor CB and the external inductor LEXT are connected between the node N1 and the node N2, and coupled in parallel with the series-resonance circuit.

A current IM is a current flowing to the series-resonance circuit, a current flowing to the external inductor LEXT is an external inductor current IEXT, and piezoelectric current IPIEZO is a current supplied to the piezoelectric circuit 10.

In further detail, a first end of the first capacitor CA is connected to the node N1. A first end of the first inductor L is connected to a second end of the first capacitor CA. A first end of the resistor R is connected to a second end of the first inductor L, and a second end of the resistor R is connected to the node N2.

The drain electrode of the first switch S1 and the drain electrode of the second switch S2 are connected to a voltage VDC, and the source electrode of the third switch S3 and the source electrode of the fourth switch S4 are connected to a ground.

A first control voltage VA is applied to the gate electrode of the first switch S1, and a second control voltage VB is applied to the gate electrode of the second switch S2. A third control voltage VC is applied to the gate electrode of the third switch S3, and a fourth control voltage VD is applied to the gate electrode of the fourth switch S4.

Both-end voltages of the first to fourth switches S1 to S4 are respectively referred to as first to fourth switch voltages VP1 to VP4.

Hereinafter, a driving method of the piezoelectric circuit 10 will be described with reference to FIG. 2 and FIG. 3A to FIG. 3E.

Figure 2:
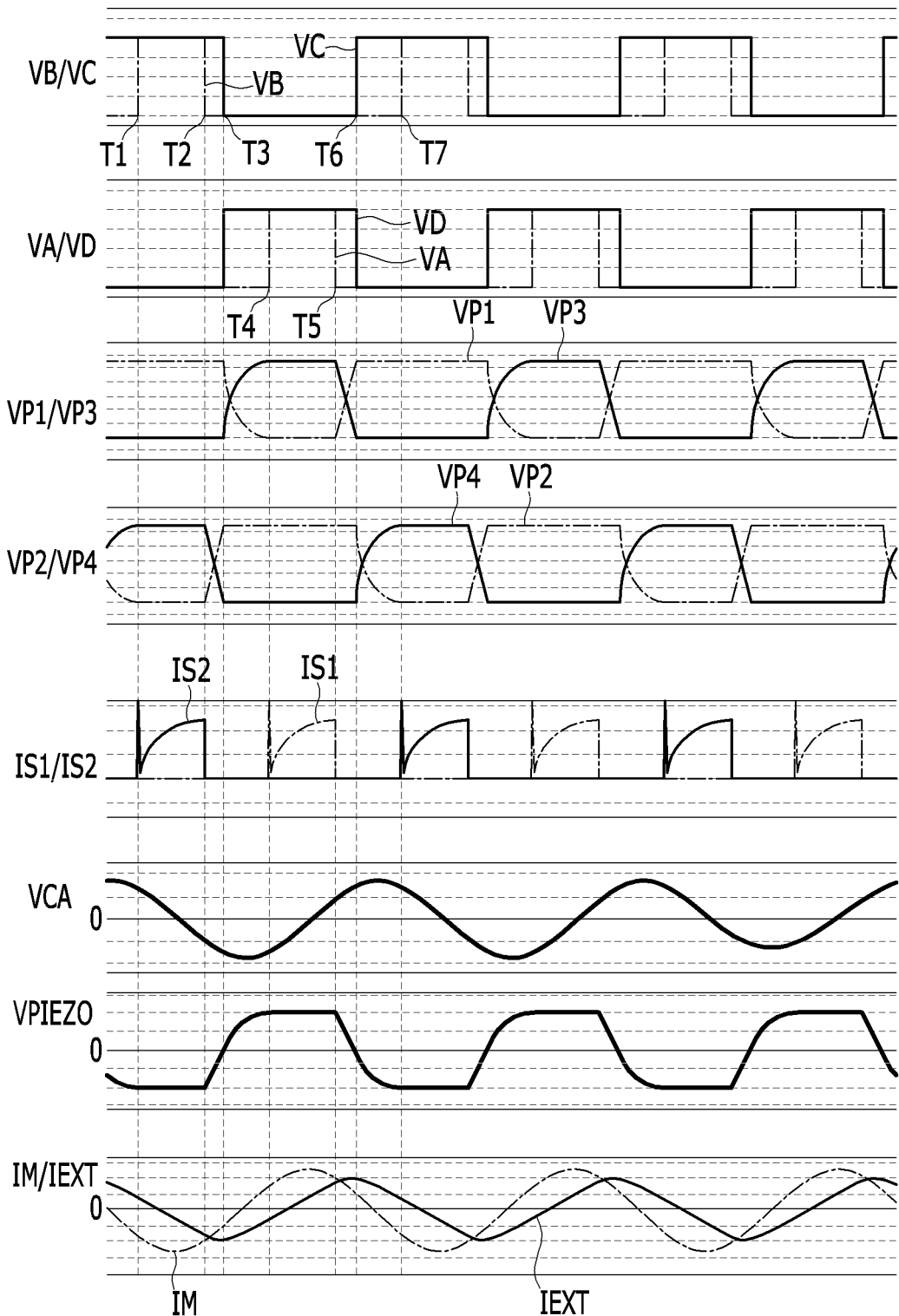
FIG. 2 is a waveform diagram of voltages and currents generated in the piezoelectric circuit and the piezoelectric driving circuit and control voltages of the piezoelectric driving circuit according to the exemplary embodiment of the present invention.

FIG. 2 is a waveform diagram of a voltage and a current generated in the piezoelectric circuit and the piezoelectric driving circuit and control voltages of the piezoelectric driving circuit according to the exemplary embodiment of the present invention.

FIG. 3A to 3E show a switching state of the piezoelectric driving circuit according to the corresponding period.

At T1, the second control voltage VB becomes high level, and the second switch S2 is turned on. At T2, the second control voltage VB becomes low level, and the second switch S2 is turned off.

Figure 3A:
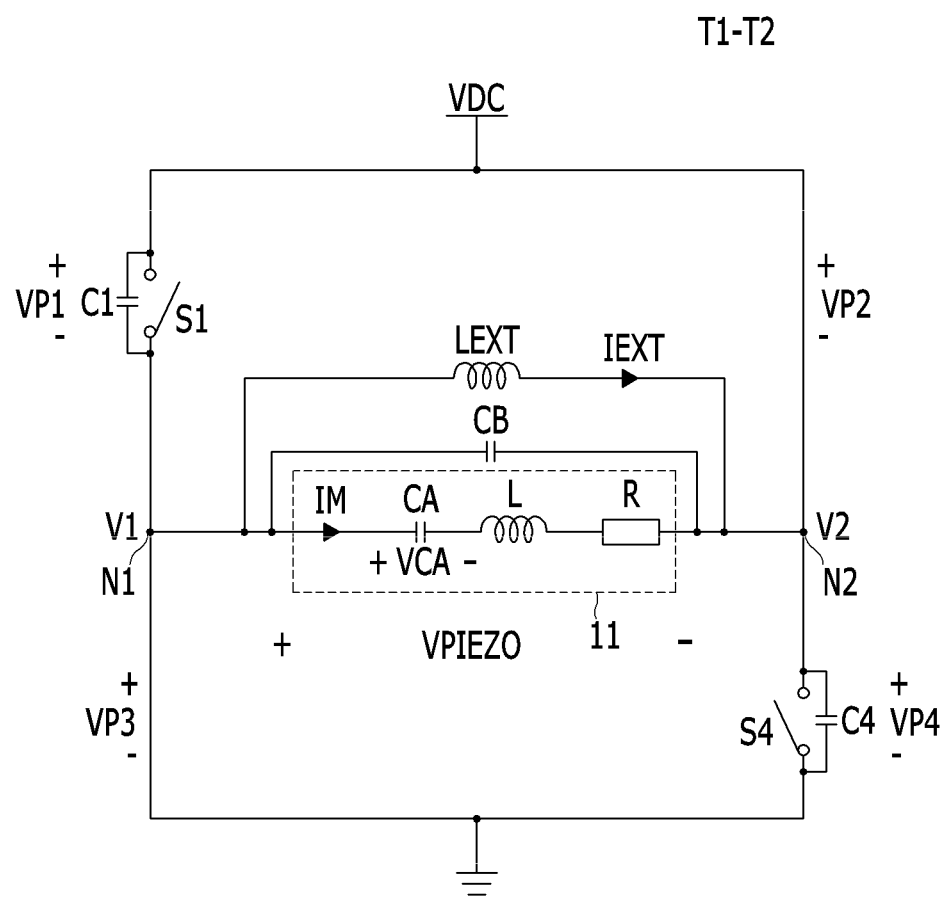
FIG. 3A shows a switching state of the piezoelectric driving circuit during a turn-on period of the second and third switches.

FIG. 3A shows a switching state of the piezoelectric driving circuit during a turn-on period of the second and third switches.

As shown in FIG. 2, the second switch voltage VP2 is zero at T1. Since the third switch S3 is in the turn-on state at T1, the voltage VDC is connected to the piezoelectric circuit 10 during a period T1 to T2, and the peak of the second switch current IS2 is generated at T1 to charge the first capacitor CA and the second capacitor CB.

However, the peak is significantly lower than the peak generated in the conventional driving of a piezoelectric current that does not include external inductor LEXT. This will be described later with reference to FIG. 4.

During the period T1 to T2, the second switch current IS2 is increased, and the both-end voltage of the piezoelectric circuit 10 is maintained with a negative voltage −VDC. The polarity of the piezoelectric voltage VPIEZO is determined based on the potential of the node N2, shown in FIG. 1. That is, when the potential of the node N1 is higher than the node N2, the polarity is positive, and the polarity is negative in the opposite case.

During the period T1 to T2, the current IM flows to the node N1 from the node N2 and the voltage of the capacitor CA is decreased. The direction of the external inductor current IEXT is changed during the period T1 to T2 such that the external inductor current IEXT flows to the same direction of the current IM. Hereinafter, a direction toward the node N2 from the node N1 is referred to as a positive direction and the opposite is referred to as a negative direction for convenience of description.

As shown in FIG. 3A, since the first switch S1 and the fourth switch S4 are in the turn-off state during the period T1 to T2, the first switch voltage VP1 and the fourth switch voltage VP4 are the voltage VDC, and since the second switch S2 and the third switch S3 are in the turn-on state, the second switch voltage VP2 and the third switch voltage VP3 are zero.

Figure 3B:
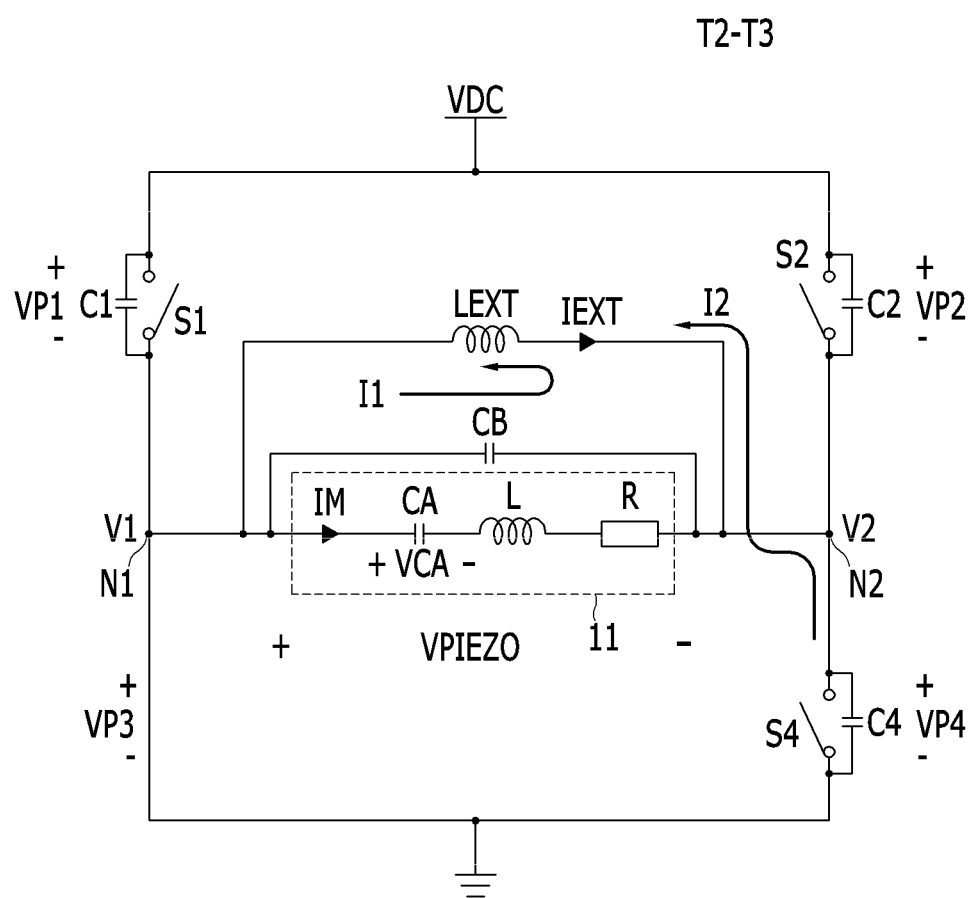
FIG. 3B shows a switching state of the piezoelectric driving circuit during a turn-on period of the third switch only.

FIG. 3B shows a switching state of the piezoelectric driving circuit during the turn-on period of the third switch only.

The second switch S2 is turned off at T2. After T2, the capacitor C4 is discharged by the external inductor current IEXT such that the fourth switch voltage VP4 is decreased. At T3 that the fourth switch voltage VP4 reaches zero, the fourth switch S4 is turned on (zero voltage switching).

From T2, the external inductor current IEXT charges the capacitor C2. Accordingly, the second switch voltage VP2 starts to increase due to charging of the capacitor C2 from T2.

During a period T2 to T3, the capacitor CB and the capacitor C4 are discharged by the external inductor current IEXT. For the zero voltage switching of the fourth switch S4, the capacitor CB and the capacitor C4 are discharged and thus the fourth switch voltage VP4 should reach zero voltage.

The capacitor CB is discharged by the current 11 and the capacitor C4 is discharged by the current 12, shown in FIG. 3B. Since the flow of the external inductor current IEXT maintains the negative direction after T2, the capacitors C4 and CB are discharged such that a condition for the zero voltage switching of the fourth switch S4 is satisfied.

As shown in FIG. 2, the external inductor current IEXT flows to the negative direction during the period T2 to T3, and includes the current 11 and the current 12 shown in FIG. 3B.

Figure 3C:
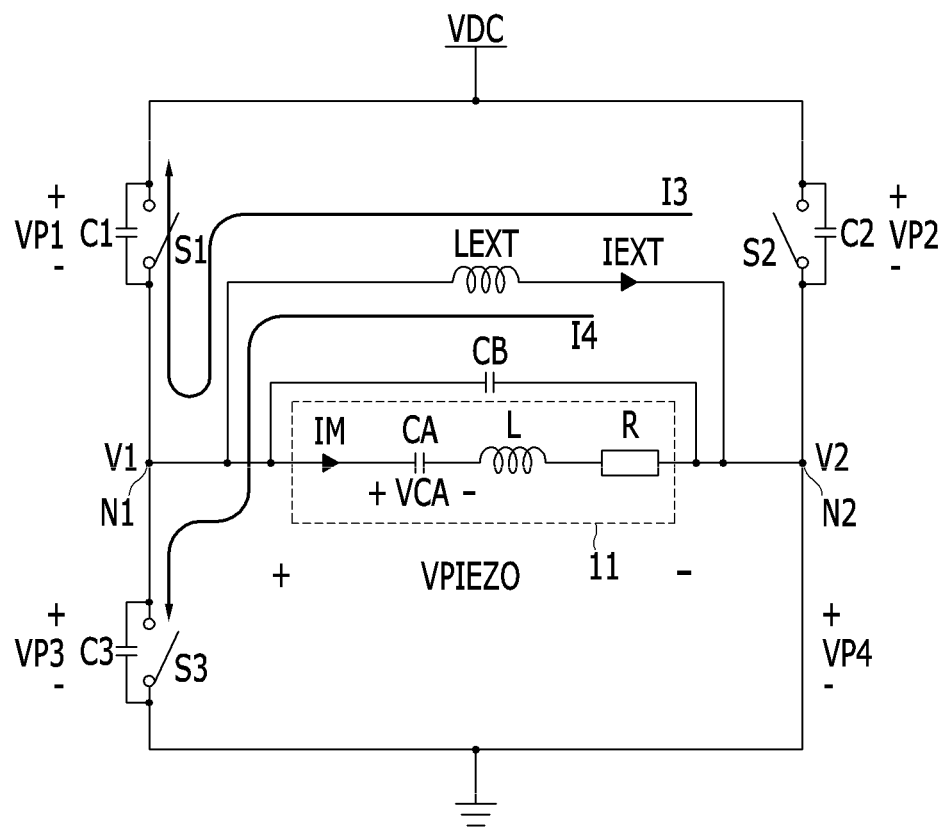
FIG. 3C shows a switching state of the piezoelectric driving circuit during a turn-on period of the fourth switch only.

FIG. 3C shows a switching state of the piezoelectric driving circuit during the turn-on period of the fourth switch only.

At T3, the fourth control voltage VD becomes high level and the fourth switch S4 is turned on. At T3, the third control voltage VC become low level and the third switch S3 is turned off. At T3, the fourth switch voltage VP4 is zero so that the fourth switch S4 is zero-voltage switched.

The capacitor C1 is discharged and the capacitor C3 is charged by the external inductor current IEXT of the external inductor LEXT from T3. In further detail, as shown in FIG. 3C, the capacitor C1 is discharged by the current 13 and thus the first switch voltage VP1 starts to decrease from T3, and the capacitor C3 is charged by the current 14 and thus the third switch voltage VP3 starts to increase from T3.

The first switch voltage VP1 becomes zero at T4, and the first control voltage VA becomes high level and thus the first switch S1 is turned on. At T4, the third switch voltage VP3 is the voltage VDC.

Figure 3D:
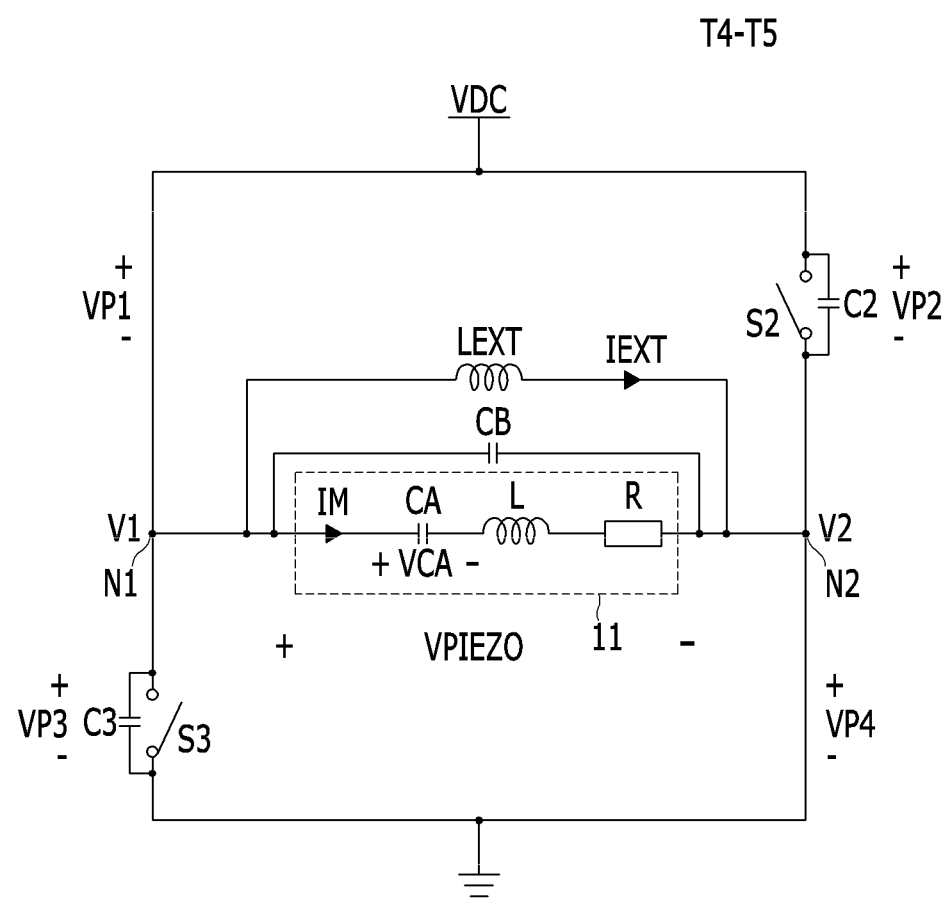
FIG. 3D shows a switching state of the piezoelectric driving circuit during a turn-on period of the first and fourth switches.

FIG. 3D shows a switching state of the piezoelectric driving circuit during the turn-on period of the first and fourth switches.

Since the fourth switch S4 is in the turn-on state at T4, the voltage VDC is connected to the piezoelectric circuit 10 during a period T4 to T5, and the peak of the switch current 151 is generated at T4 to charge the first capacitor CA and the second capacitor CB. However, the peak current is also low compared to the conventional case.

At T5, the first control voltage VA becomes low level and the first switch S1 is turned off. During the period T4 to T5, the first switch current 151 is increased and a both-end voltage of the piezoelectric circuit 10 is maintained with a positive voltage VDC.

The current IM flows in the positive direction and the voltage of the capacitor CA is increased during the period T4 to T5. During the period T4 to T5, the direction of the external inductor current IEXT is changed to the same direction of the current IM.

As shown in FIG. 3D, the second and third switches S2 and S3 are in the turn-off state during the period T4 to T5, and therefore the second switch voltage VP2 and the third switch voltage VP3 are the voltage VDC, and the first and fourth switches S1 and S4 are in the turn-on state, and therefore the first switch voltage VP1 and the fourth switch voltage VP4 are zero.

Figure 3E:
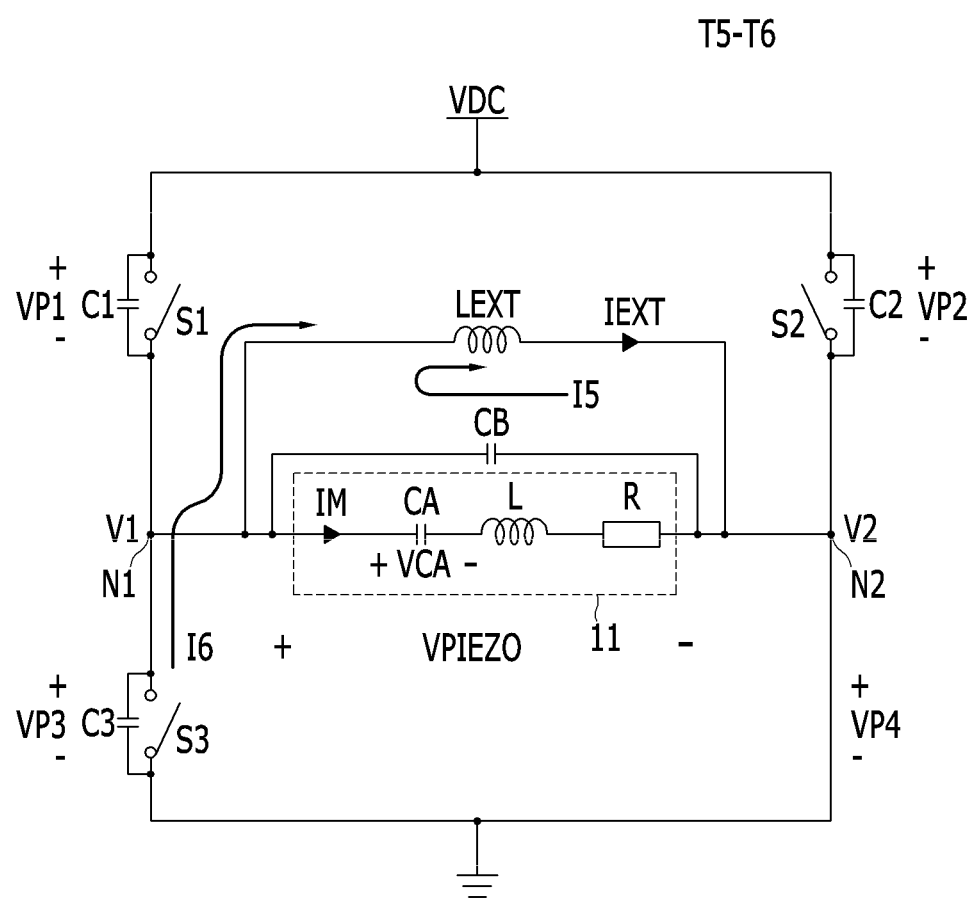
FIG. 3E shows a switching state of the piezoelectric driving circuit during a turn-on period of the fourth switch only.

FIG. 3E shows a switching state of the piezoelectric driving circuit during the turn-on period of the fourth switch only.

The switch S1 is turned off at T5. After T5, the capacitor C3 is discharged by the external inductor current IEXT and thus the third switch voltage VP3 is decreased. At T6 that the third switch voltage VP3 reaches zero, the third switch S3 is turned on (i.e., zero voltage switching).

From T5, the inductor IEXT charges the capacitor C1. Thus, the first switch voltage VP1 starts to increase by charging of the capacitor C1 from T5.

During a period T5 to T6, the capacitor CB and the capacitor C3 are discharged by the external inductor current IEXT. For zero voltage switching of the third switch S3, the capacitor CB and the capacitor C3 should be discharged and thus the third switch voltage VP3 should reach zero. The capacitor CB is discharged by the current 15 and the capacitor C3 is discharged by the current 16, shown in FIG. 3E. Since the external inductor current IEXT flows to the positive direction after T5, the capacitors C3 and CB are discharged and thus a condition for the zero voltage switching of the third switch S3 is satisfied.

As shown in FIG. 2, the external inductor current IEXT flows to the positive direction during a period T5 to T6, and includes the current 15 and the current 16 shown in FIG. 3E.

Figure 3F:
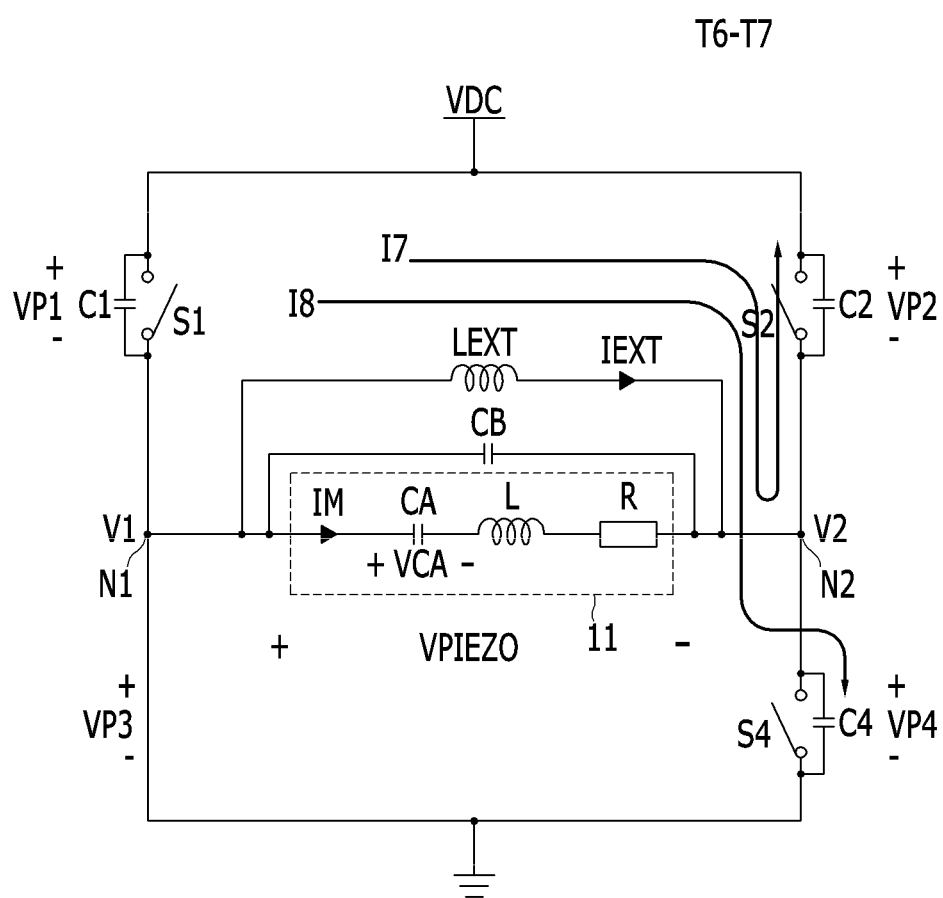
FIG. 3F shows a switching state of the piezoelectric driving circuit during a turn-on period of the third switch only.

FIG. 3F shows a switching state of the piezoelectric driving circuit during the turn-on period of the third switch only.

At T6, the third control voltage VC becomes high level and the third switch S3 is turned on. At T6, the fourth control voltage VD becomes low level and the fourth switch S4 is turned off. At T6, the third switch voltage VP3 is zero, and therefore the third switch S3 zero-voltage switched.

From T6, the capacitor C2 is discharged and the capacitor C4 is charged by the external inductor current IEXT of the external inductor LEXT. In further detail, as shown in FIG. 3F, the capacitor C2 is discharged by the current 17 and thus the second switch voltage VP2 starts to decrease from T6, and the capacitor C4 is charged by the current 18 and thus the fourth switch voltage VP4 starts to increase from T6.

The second switch voltage VP2 becomes zero at T7, and the second control voltage VB becomes high level and thus the second switch S2 is turned on. At T7, the fourth switch voltage VP4 is the voltage VDC.

The repetitive operation happens in the next as the operation from T1 to T7, and therefore no further description will be provided.

A delay time of a turn-on instant of the first switch S1 compared to a turn-on instant of the fourth switch S4 is determined according to a period during which the first switch voltage VP1 reaches zero by the external inductor current IEXT. In addition, a preceding time of a turn-off instant of the first switch S1 compared to a turn-off instant of the fourth switch S4 is determined according to a period during which the third switch voltage VP3 reaches zero by the external inductor current IEXT.

Likely, a delay time of a turn-on instant of the second switch S2 compared to a turn-on instant of the third switch S3 is determined according to a period during which the second switch voltage VP2 reaches zero by the external inductor current IEXT. In addition, a preceding time of a turn-off instant of the second switch S2 compared to a turn-off instant of the third switch S3 is determined according to a period during which the fourth switch voltage VP4 reaches zero by the external inductor current IEXT.

As shown in FIG. 2, the piezoelectric voltage VPIEZO alternatively has a positive voltage VDC or a negative voltage VDC according to switching operation of the piezoelectric driving circuit 20. In this case, all switches are turning on and off under the zero voltage switching conditions. Accordingly, the peak current is decreased compared to the conventional case.

Figure 4:
FIG. 4 shows a piezoelectric current flowing to a conventional piezoelectric circuit and a piezoelectric current according to the exemplary embodiment of the present invention.

FIG. 4 shows a piezoelectric current according to the conventional piezoelectric driving circuit and a piezoelectric current according to the exemplary embodiment of the present invention.

The conventional piezoelectric current is obtained assuming the piezoelectric driving circuit performs half-zero voltage switching.

As shown in FIG. 4, the peak of the conventional piezoelectric current is much higher than the peak of the piezoelectric current PIEZO according to the exemplary embodiment of the present invention.

If the peak current of FIG. 4 does not exist entirely, the shape of the current is a sinusoidal waveform. Since the peak shown in FIG. 4 is still higher than a piezoelectric current following the sinusoidal waveform, even though the peak current of the exemplary embodiment of the present invention is significantly lower than the peak of the conventional piezoelectric current, we cannot notice that the current have the shape of a sinusoidal waveform.

The piezoelectric driving circuit according to the exemplary embodiment of the present invention reduces the peak current so that input power can be reduced compared to a conventional piezoelectric driving circuit. That is, a switching loss can be reduced through full-zero voltage switching, thereby reducing power consumption.

In further detail, a voltage determining mechanical movement of the piezoelectric circuit is a both-end voltage of the capacitor CA. Input power according to the exemplary embodiment of the present invention is lower than the input power required for the conventional piezoelectric circuit to obtain the same voltage VCA shown in FIG. 2. Accordingly, the piezoelectric circuit according to the exemplary embodiment of the present invention needs less electrical energy to obtain the same amount of mechanical energy compared to the conventional piezoelectric circuit.

In addition, all switches are turning on and off when the both-end voltage of each of the first to fourth switches reaches zero according to the exemplary embodiment of the present invention, but a margin may exist between a time point that the both-end voltage reaches zero and a time point that the corresponding switch turns on.

Further, the turn-off of the third switch and the turn-on of the fourth switch are the same in the exemplary embodiment of the present invention, but a predetermined dead time may exist between the two time points. In addition, the turn-off of the fourth switch and the turn-on of the third switch are the same in the exemplary embodiment of the present invention, but a predetermined dead time may also exist between the two time points.

In further detail, in FIG. 2, a dead time may exist between T3 (a time point that VP4 reaches zero voltage) and the turn-on of the fourth switch S4, and a dead time may exist between T6 (i.e., a time point that VP3 reaches zero voltage) and the turn-on of the third switch S3.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of symbols>
piezoelectric circuit 10, first inductor L, external inductor LEXT first capacitor CA, second capacitor CB, resistor R
piezoelectric driving circuit 20, body diodes BD1 to BD4,
parasitic capacitors C1 to C4
first to fourth switches S1 to S4, series-resonance circuit 11

What is claimed is:

1. A piezoelectric circuit comprising a sub-piezoelectric circuit and an inductor coupled to the sub-piezoelectric circuit in parallel,
wherein the inductor is configured to discharge the sub-piezoelectric circuit when a polarity of a piezoelectric voltage between both ends of the piezoelectric circuit is inverted.

2. The piezoelectric circuit of claim 1, wherein the sub-piezoelectric circuit comprises
a series-resonance circuit including a first capacitor, a first inductor, and a resistor that are coupled in series, and
a second capacitor coupled to the series-resonance circuit in parallel.

3. A piezoelectric driving circuit comprising:
a sub-piezoelectric circuit coupled between a first node and a second node,
an inductor coupled to the sub-piezoelectric circuit in parallel, the inductor comprising a first terminal coupled to the first node and a second terminal coupled to the second node; and
a full-bridge circuit including first and third switches coupled to the first node and second and fourth switches coupled to the second node.

4. The piezoelectric driving circuit of claim 3, wherein the first switch comprises a first electrode configured to be coupled to a first voltage, a second electrode coupled to the first node, and a control electrode configured to be coupled to a first control voltage, and
the third switch comprises a first electrode coupled to the first node, a second electrode coupled to a ground, and a control electrode configured to be coupled to a third control voltage.

5. The piezoelectric driving circuit of claim 4, wherein the second switch comprises a first electrode configured to be coupled to the first voltage, a second electrode coupled to the second node, and a control electrode configured to be coupled to a second control voltage, and
the fourth switch comprises a first electrode coupled to the second node, a second electrode coupled to the ground, and a control electrode configured to be coupled to a fourth control voltage.

6. The piezoelectric driving circuit of claim 5, wherein the first switch is configured to be turned on after a first period from a turn-on of the fourth switch and turned off at a second period, wherein the second period occurs before a turn off of the fourth switch, and
the first period is based on a period during which a both-end voltage of the first switch becomes zero by a current of the inductor and the second period is based on a period during which a both-end voltage of the third switch becomes zero by the inductor current.

7. The piezoelectric driving circuit of claim 5, wherein the second switch is configured to be turned on after a third period from a turn-on of the third switch and turned off at a fourth period, wherein the fourth period occurs before a turn off of the third switch, and
the third period is based on a period during which a both-end voltage of the second switch becomes zero by the inductor current and the fourth period is based on a period during which a both-end voltage of the fourth switch becomes zero by the inductor current.

8. The piezoelectric-driving circuit of claim 3, wherein the sub-piezoelectric circuit comprises a first capacitor, a first inductor, a resistor, and a second capacitor, and the first capacitor, the first inductor, and the resistor are coupled in series between the first node and the second node and the second capacitor is coupled between the first node and the second node.

9. A driving method of a piezoelectric circuit including a sub-piezoelectric circuit and an inductor coupled in parallel with the sub-piezoelectric circuit, comprising:
turning on a second switch after a first period from a turn-on of a third switch, wherein the first and the third switches are configured to be coupled to a first end of the piezoelectric circuit and a second and fourth switches are configured to be coupled to a second end of the piezoelectric circuit;
turning off the third switch after a second period from a turn-off of the second switch;
turning on the first switch after a third period from a turn-on of the fourth switch; and
turning off the fourth switch after a fourth period from a turn-off of the first switch.

10. The driving method of the piezoelectric circuit of claim 9, further comprising, during the second period, decreasing a both-end voltage of the fourth switch to approximately zero due to discharging of a parasitic capacitor of the fourth switch and the second capacitor by the inductor current and turning on the fourth switch.

11. The driving method of the piezoelectric circuit of claim 10, wherein, during the second period, a both-end voltage of the second switch is increased by the inductor current.

12. The driving method of the piezoelectric circuit of claim 9, further comprising, during the third period, decreasing a both-end voltage of the first switch to approximately zero due to discharging of a parasitic capacitor of the first switch by the inductor current.

13. The driving method of the piezoelectric circuit of claim 12, further comprising, during the third period, increasing a both-end voltage of the third switch by the external inductor current.

14. The driving method of the piezoelectric circuit of claim 9, further comprising, during the fourth period, decreasing a both-end voltage of the third switch to approximately zero due to discharging of a parasitic capacitor of the third switch and the second capacitor by the inductor current and turning on the third switch.

15. The driving method of the piezoelectric circuit of claim 14, further comprising, during the fourth period, increasing the both-end voltage of the first switch by the inductor current.

16. The driving method of the piezoelectric circuit of claim 9, further comprising, during the first period, decreasing a both-end voltage of the second switch to approximately zero due to discharging of a parasitic capacitor of the second switch by the inductor current.

17. The driving method of the piezoelectric circuit of claim 16, further comprising, during the first period, increasing a both-end voltage of the fourth switch by the inductor current.

18. The driving method of the piezoelectric circuit of claim 9, further comprising, during a turn-on period of the first and fourth switches, supplying a first voltage to a first end of the piezoelectric circuit and supplying a second voltage to a second end of the piezoelectric circuit.

19. The driving method of the piezoelectric circuit of claim 9, further comprising, during a turn-on period of the second and third switches, supplying the second voltage to the first end of the piezoelectric circuit and supplying the first voltage to the second end of the piezoelectric circuit.

20. The driving method of the piezoelectric circuit of claim 9, wherein the sub-piezoelectric circuit comprises a series-resonance circuit including a first capacitor, a first inductor, and a resistor that are coupled in series and a second capacitor coupled in parallel with the series-resonance circuit.

* * * * *